United States Patent
Ramsdsen

(10) Patent No.: US 7,132,864 B1
(45) Date of Patent: Nov. 7, 2006

(54) METHOD FOR CONFIGURING MULTIPLE-OUTPUT PHASE-LOCKED LOOP FREQUENCY SYNTHESIZER

(75) Inventor: Edward A. Ramsdsen, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 103 days.

(21) Appl. No.: 10/744,353

(22) Filed: Dec. 22, 2003

(51) Int. Cl.
*H03L 7/06* (2006.01)

(52) U.S. Cl. ...................... 327/156; 327/147
(58) Field of Classification Search ................ 327/141, 327/145–150, 156–159
See application file for complete search history.

(56) References Cited

U.S. PATENT DOCUMENTS

| | | | | |
|---|---|---|---|---|
| 5,986,485 A * | 11/1999 | O'Sullivan | ................... | 327/156 |
| 6,542,040 B1 * | 4/2003 | Lesea | ........................ | 331/11 |
| 6,608,530 B1 * | 8/2003 | Green et al. | ................... | 331/25 |
| 2002/0190764 A1 * | 12/2002 | Nichols | ...................... | 327/156 |

OTHER PUBLICATIONS

"Software Download: RoboConfig 1.0", Cypress Semiconductor Corporation, copyright 1995-2003.
"High-Speed Multi-Phase PLL Clock Buffer", Cypress Semiconductor Corporation, Jul. 25, 2003.

* cited by examiner

*Primary Examiner*—Timothy P. Callahan
*Assistant Examiner*—Cassandra Cox

(57) ABSTRACT

A method is provided to configure a multiple-output phase-locked loop frequency synthesizer based upon a desired set of output frequencies. The method includes an act of selecting a candidate output frequency(s) for the synthesizer's VCO and corresponding configurations for the output dividers. Based upon the candidate output frequency(s) and corresponding output divider configurations, the method provides another act of selecting a suitable feedback signal and input and feedback divider configurations. The resulting various potential configurations for the frequency synthesizer are tested based upon predetermined suitable criteria to provide a selected frequency synthesizer configuration.

24 Claims, 3 Drawing Sheets

FIG. 3

METHOD FOR CONFIGURING MULTIPLE-OUTPUT PHASE-LOCKED LOOP FREQUENCY SYNTHESIZER

TECHNICAL FIELD

The present invention relates generally to phase-locked loop frequency synthesis, and more particularly to a method for configuring a multiple-output phase-locked loop frequency synthesizer.

BACKGROUND

Phase-locked loops are often used as clock regenerators or frequency synthesizers in digital systems. By including multiple output dividers, a phase-locked loop with a single VCO output frequency may act as a frequency synthesizer that generates multiple output frequencies. For example, FIG. 1 illustrates a multiple-output phase-locked loop frequency synthesizer 100. Frequency synthesizer 100 synthesizes five output signals 105 having frequencies $f_1$ through $f_5$, respectively. Depending upon the frequency division provided by a corresponding output divider 110 for each output signal 105, each of the frequencies $f_1$ through $f_5$ is a fraction of the output frequency of a voltage-controlled oscillator (VCO) 115. One of the output signals 105 is selected by a multiplexer 140 for use as a feedback signal, divided by a feedback divider 145, and received at a phase detector 150. Similarly, phase detector 150 also receives a divided version of an input signal 130 after processing by an input divider 155. A loop filter 160 receives the output of phase detector 150 and drives VCO 115. In this fashion, depending upon the settings of input divider 155, feedback divider 145, output dividers 110, and multiplexer 140, the synthesis of frequencies $f_1$ through $f_5$ is kept coherent with the frequency of input signal 130.

Although operation of frequency synthesizer 100 is relatively straightforward, configuring it to provide a desired set of output frequencies is not. Instead, considerable preparation is required in the configuration of the various dividers, the selection of the feedback signal, and the selection of a candidate VCO output frequency to provide the desired output frequencies based upon an input reference frequency of an input signal 130. For example, if each of the seven dividers 155, 145, and 110 in frequency synthesizer 100 has 32 settings (5 bit selection), these dividers alone provide $32^7$ different configurations. Taking into account the additional freedom one has in choosing a feedback signal from the five output signals 105, frequency synthesizer 100 may be configured over one hundred billion different ways. Given such a large search space, it is impractical to search for optimal solutions through a brute force application. Moreover, the non-linear interaction of the various dividers prevents easy convergence to an optimal solution in an analytical approach.

Accordingly, there is a need in the art for improved techniques to configure multiple-output frequency synthesizers.

SUMMARY

One aspect of the invention relates to a method of configuring a multiple-output phase-locked loop frequency synthesizer. The method includes the acts of providing a desired set of output frequencies; determining a candidate output frequency(s) for the synthesizer's VCO and corresponding configuration for each output divider based upon the desired set of output frequencies; for each candidate output frequency(s) and corresponding configuration for each output divider, determining a corresponding selection for a feedback signal and for a configuration of the synthesizer's input and feedback divisors, wherein each combination of a candidate output frequency, selection of a feedback signal, and configuration of the output, feedback, and input dividers determines a potential configuration of the frequency synthesizer; and testing the suitability of each potential configuration based upon predetermined suitability criteria.

BRIEF DESCRIPTION OF THE DRAWINGS

FIG. 3 is a screenshot of a graphical user interface provided by a software tool that incorporates the configuration technique of FIG. 2.

Use of the same reference symbols in different figures indicates similar or identical items.

DETAILED DESCRIPTION

Figure 1:
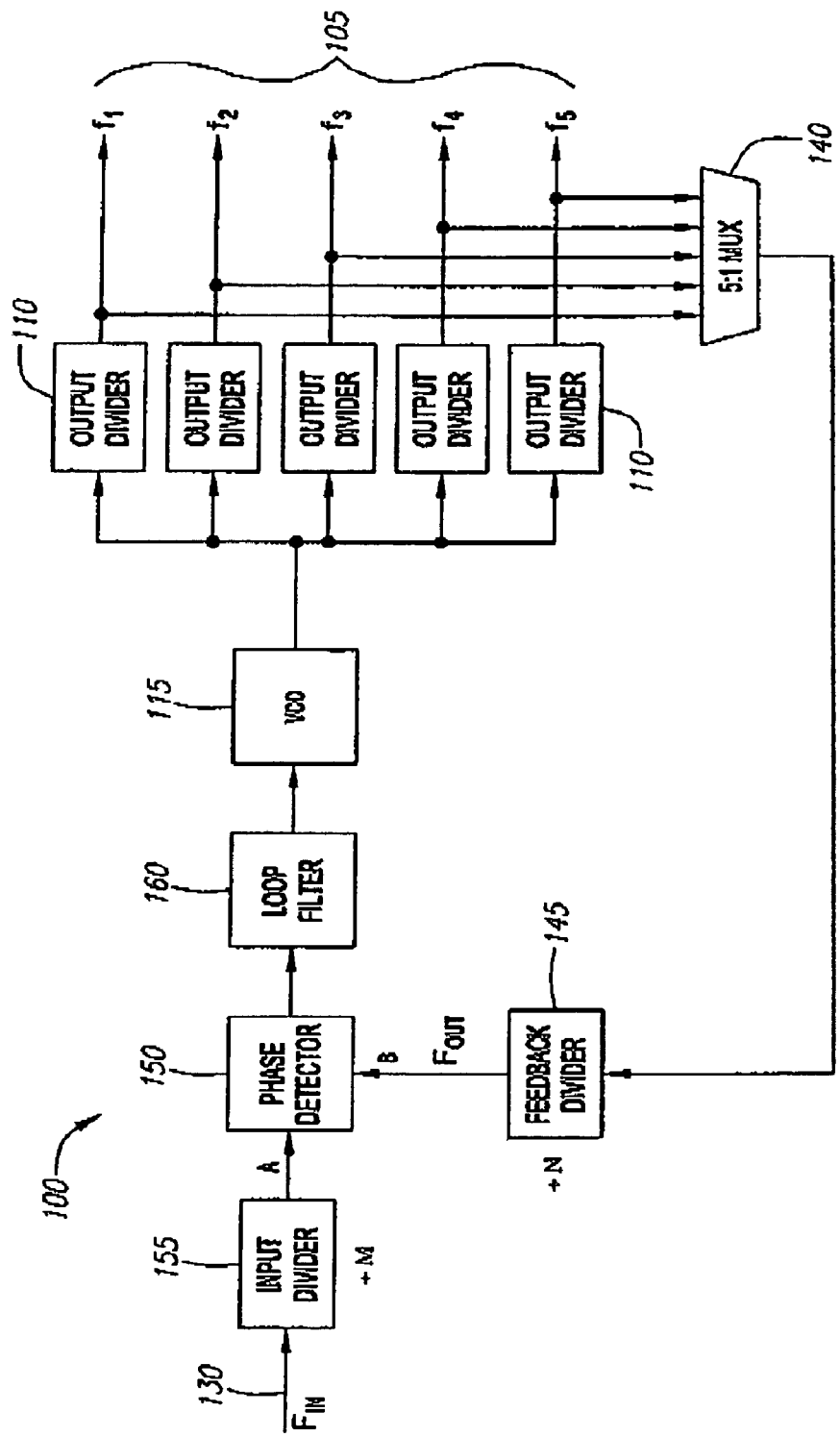
FIG. 1 is a block diagram overview of a multiple-output phase-locked loop frequency synthesizer.

The technique for configuring a multiple-output phase-locked loop frequency synthesizer will be explained with respect to frequency synthesizer 100 of FIG. 1, which has five output signals 105. However, it will be appreciated that the configuration technique disclosed herein is not limited to any particular number of output signals or phase-locked loop frequency synthesizer topology. Although the various dividers for frequency synthesizer 100 are provided with 5-bit control (32 different divider settings), the configuration technique disclosed herein is not limited to any particular divider dynamic range. With respect to frequency synthesizer 100, each output divider 110 provides a frequency division selected from a set such as the set of {2, 4, 6, . . . , 64} depending upon its 5-bit configuration. Similarly, both input divider 155 and feedback divider 145 provide a frequency division selected from a set such as the set of {1, 2, 3, . . . 32} depending upon their 5-bit configuration.

The frequency synthesizer configuration technique begins by determining a set of desired synthesized output frequencies. Because these output frequencies are merely desired, they will be denoted as $f_1'$ through $f_5'$ to distinguish them from the actual frequencies $f_1$ through $f_5$ synthesized by frequency synthesizer 100. The actual frequencies $f_1$ through $f_5$ are determined by the output frequency of VCO 115 and the corresponding output divider 110 configuration for each output signal 105. In this regard, one may desire a frequency synthesizer 100 configuration such that output frequencies $f_1$ through $f_5$ exactly satisfy the desired set of output frequencies $f_1'$ through $f_5'$. Alternatively, one may accept a certain tolerance with respect to the desired output frequencies $f_1'$ through $f_5'$ such that the synthesized output frequencies $f_1$ through $f_5$ are not (in part or all) exact matches but are instead within the acceptable tolerances about the desired output frequencies. Configurations that are within the acceptable tolerances may be denoted as partial solutions or "close" solutions.

Given the set of desired output frequencies f1' through f5', the selection of both a candidate output frequency(s) for VCO 115 and the configurations for output dividers 110 may be determined. However, regardless of whether an exact match of output frequencies f1' through f5' is desired, the selection of a candidate VCO output frequency is affected by each and every desired output frequency. For example, assume that f1' equals 20 MHz and that a candidate output frequency of VCO 115 is 400 MHz is considered. In this case, should an exact match be desired, the output divisor 110 for output signal 105 having frequency $f_1$ would be configured to divide the VCO output frequency by 20. Output frequency $f_1$ would then be 400 MHz divided by 20, which equals 20 MHz so that the desired match is accomplished. However, suppose in this example that $f_2'$ was 5 MHz. In this instance, even if the output divider 110 for output signal 105 having frequency $f_2$ were set to divide by its maximum value of 64, $f_2$ would equal just 6.25 MHz. Such a value for $f_2$ will not satisfy an exact match for $f_2'$ and may not be within the acceptable tolerance if a partial solution is desired. Thus, despite the suitability for synthesis of $f_1$, 400 MHz would not be a suitable candidate output frequency for, VCO 115.

If exact matches are required for the desired output frequencies $f_1'$ through $f_5'$, the output frequency of VCO 115 may be determined as an integer multiple of the least-common-multiple (LCM) of the desired output frequencies. For example, if f1' is 15 MHz, f2' is 20 MHz, and f3' is 30 MHz (for clarity, only the first three desired output frequencies will be considered), the LCM would be 60 MHz. Suppose also that an operating frequency range for VCO 115 is 320 to 640 MHz.

In this case, the integer multiples of the LCM that are within the operating frequency range for VCO 115 are {360, 420, 480, 540, and 600} MHz. The selection of any of these candidate output frequencies for VCO 115 would permit an exact match of the desired output frequencies f1' though f3'. Each candidate output frequency for VCO 115 determines a corresponding set of divisors to be used in output divisors 110 for synthesis of the desired set of output frequencies. For example, the candidate output frequency of 480 MHz for VCO 115 requires that output dividers 110 for output signals 105 having frequencies f1 through f3 would be configured to use divisors 32, 24, and 16, respectively to match desired frequencies f1' through f3'. In this fashion f1 equals 480 MHz/32, which equals the desired value of f1' (15 MHz). Similarly, f2 equals 480 MHz/24, which equals the desired value of f2' (20 MHz). Finally, f3 equals 480 MHz/16, which equals the desired value of f3' (30 MHz). Because of the limitations on the operating range for both divisors 110 and VCO 115, there may be sets of desired output frequencies that cannot be matched exactly for a given frequency synthesizer 100 configuration. In such cases, only approximate solutions may be obtained.

For example, suppose f1' is 60 MHz, f2' is 75 MHz, f3' is 90 MHz, and the VCO operating frequency range is 320 to 640 MHz. Here, the LCM is 900 MHz, which is outside the VCO operating frequency range. Thus, an exact match cannot be made for this set of desired output frequencies. A number of approaches may be used to find approximate solutions. For example, the output frequency for VCO 115 may be selected to maximize the synthesis of exact matches to the desired frequencies for output signals 105. Alternatively, the output frequency for VCO 115 may be selected to minimize the total error between the desired and synthesized frequencies for output signals 105. In either solution, a set F of candidate VCO output frequencies may be obtained from the set of desired output frequencies. Each frequency in the set F of candidate VCO output frequencies may correspond on a one-to-one basis with a corresponding desired frequency for an output signal 105. With respect to frequency synthesizer 100, the five desired output frequencies f1' through f5' each maps to a corresponding VCO candidate frequency set F1 through F5, where 'f1' maps to F1, and so on. For ease of discussion, the configuration for just three desired output frequencies f1' through f3' will be considered. The set of candidate VCO output frequencies may comprise integer multiples of each desired output frequency such that set F1 corresponding to f1' includes values {f1', 2f1', 3f1', ... }. Similarly, set F2 corresponding to f2' includes values {f2', 2f2', 3f2', ... }, and so on for the remaining set F3. By successively incrementing the sets and testing each iteration, candidate VCO output frequencies may be identified. To illustrate this technique, consider again the example wherein f1' is 60 MHz, f2' is 75 MHz, f3' is 90 MHz, and the VCO operating frequency range is 320 to 640 MHz. As a starting value, F1 may be set to f1', F2 to f2', and F3 to f3'. These candidate VCO frequencies may then be analyzed for suitability with respect to approximating or matching the desired output frequencies f1' through f3'. In this first iteration, the candidate VCO frequencies are too low with respect to the VCO operating frequency range. Thus, an efficient iteration is to increment the smallest F value. Here, F1 had been the smallest value so it is incremented to 2*f1', which equals 120 MHz. After this iteration, the candidate VCO frequencies are again too low so another iteration is performed. Here, F2 had been the lowest value so it is incremented to 2*f2', which equals 150 MHz. The resulting sets F1 through F3 based upon a number of such iterations is given in the following Table 1:

TABLE 1

| Iteration | Candidate frequencies | | | Candidate Divisors | | | Mean Freq | Common Freq |
| --- | --- | --- | --- | --- | --- | --- | --- | --- |
| | F1 | F2 | F3 | V1 | V2 | V3 | | |
| 0 | 60 | 75 | 90 | 1 | 1 | 1 | 75 | 60 |
| 1 | 120 | 75 | 90 | 2 | 1 | 1 | 95 | 120 |
| 2 | 120 | 150 | 90 | 2 | 2 | 1 | 120 | 120 |
| 3 | 120 | 150 | 180 | 2 | 2 | 2 | 150 | 120 |
| 4 | 180 | 150 | 180 | 3 | 2 | 2 | 170 | 180 |
| 5 | 180 | 225 | 180 | 3 | 3 | 2 | 195 | 180 |
| 6 | 240 | 225 | 180 | 4 | 3 | 2 | 215 | 240 |
| 7 | 240 | 225 | 270 | 4 | 3 | 3 | 245 | 240 |
| 8 | 240 | 300 | 270 | 4 | 4 | 3 | 270 | 240 |
| 9 | 300 | 300 | 270 | 5 | 4 | 3 | 290 | 300 |
| 10 | 300 | 300 | 360 | 5 | 4 | 4 | 320* | 300 |
| 11 | 360 | 300 | 360 | 6 | 4 | 4 | 340* | 360* |
| 12 | 360 | 375 | 360 | 6 | 5 | 4 | 365* | 360* |
| 13 | 420 | 375 | 360 | 7 | 5 | 4 | 385* | 420 |
| 14 | 480 | 375 | 450 | 8 | 5 | 5 | 435* | 480 |
| 15 | 480 | 450 | 450 | 8 | 6 | 5 | 460* | 450* |
| 16 | 480 | 525 | 450 | 8 | 7 | 5 | 485* | 480 |
| 17 | 480 | 525 | 540 | 8 | 7 | 6 | 515* | 480 |
| 18 | 540 | 525 | 540 | 9 | 7 | 6 | 535* | 540* |
| 19 | 540 | 600 | 540 | 9 | 8 | 6 | 560* | 540* |
| 20 | 600 | 600 | 540 | 10 | 8 | 6 | 580* | 600* |
| 21 | 600 | 600 | 630 | 10 | 8 | 7 | 610* | 600* |
| 22 | 660 | 600 | 630 | 11 | 8 | 7 | 630* | 660 |
| 23 | 660 | 675 | 630 | 11 | 9 | 7 | 655 | 660 |

Inspection of Table 1 indicates the relationship between a candidate VCO output frequency and corresponding divisors V1 through V3 used in three output dividers 110 to generate frequencies f1 through f3, respectively. As each candidate VCO frequency is incremented in a set F, the corresponding divisor V is also incremented so that the desired output frequency is synthesized. For example, consider iteration number 1. Here, candidate VCO frequency F1 was the one incremented so the corresponding divisor V1 is also incremented by one. In the next iteration, candidate VCO frequency F2 was the one incremented so the corresponding divisor V2 is also incremented by one, and so on for the remaining iterations. Eventually, after a certain number of iterations, candidate VCO frequencies will be derived that are within the VCO operating frequency range (in this example, 320 to 640 MHz). For example, when the set {F1, F2, F3} have been incremented to equal {300, 300, 360} in the 10$^{th}$ iteration, the mean of this set (320 MHz) is within the operating frequency range for VCO 115. In this case, if the output frequency for VCO 115 is then set to the mean value of 320 MHz, the synthesized values for f1, f2, and f3 equal 64 MHz, 80 MHz, and 80 MHz, respectively. The resulting error between the desired output frequencies and the synthesized output frequencies (4 MHz for f1 and 5 MHz each for f2 and f3) is the minimum achievable for the set of candidate VCO frequencies F1 through F3 used at iteration number 10. As the candidate VCO frequencies are incremented in further iterations, the mean VCO frequency will continue to rise. At iteration number 23, the mean VCO frequency is outside the operating range, making further iterations unnecessary. For each iteration within Table 1, the means of the VCO candidate frequencies that are within the VCO operating frequency range of 320 to 640 MHz are marked with asterisks.

As discussed above, rather than focus upon minimizing the total error using a mean VCO frequency from the set of candidate VCO frequencies, another possible approach is to choose a candidate VCO frequency within the VCO operating frequency range that produces the maximum number of exact matches to desired output frequencies f1' through f3' (the candidate VCO frequency for each iteration that produces the most matches is denoted as the "common frequency" in Table 1). Note that there may be iterations in which only one output frequency can be matched exactly. In such a case, one may choose arbitrarily from the candidate values F1 through F3 at that iteration, assuming that each candidate value is within the VCO operating frequency range. For such a case, if F1 is chosen as the candidate VCO frequency, then only f1' will be matched. Similarly, if F2 or F3 is chosen, then only f2' or f3' will be matched. However, note that each candidate value F1 through F3 is incremented by the corresponding value of f1' through f3', respectively. In this example, f1' has the smallest value such that as F1 is incremented, it will produce more sample points within the VCO operating frequency range. Thus, for iterations shown in Table 1 wherein only one desired output frequency f' can be matched, the candidate VCO frequency corresponding to F1 will be chosen. However, it will be appreciated that other selections could be made.

In the example discussed with respect to Table 1, the desired output frequencies f1' through f3' were such that in no iteration within the VCO operating frequency range did all three candidate VCO frequencies F1 through F3 equal one another. However, a number of iterations did produce matches of two candidate VCO frequencies. For example, in iteration eleven, both F1 and F3 equaled 360 MHz such that the most common candidate VCO frequency would be 360 MHz for that iteration. Selecting this value for the output frequency of VCO 115 produces values for the set {f1, f2, f3} of 60 MHz, 90 MHz, and 90 MHz, respectively, using the corresponding values for the divisors V1 through V3. As expected, the realized values for f1 and f3 match exactly the desired values f1' and f3' whereas f2 does not match f2'. A similar situation exists, for example, at iteration 12 where F1 and F3 again equal 360 MHz. Using 360 MHz as the output frequency for VCO 115 and using the corresponding set of candidate divisors V1 through V3 from iteration 12 produces values for the set {f1, f2, f3} of 60 MHz, 72 MHz, and 90 MHz. A number of common frequency matches may be made within the VCO operating frequency range in this fashion. In Table 1, candidate VCO frequencies within the VCO operating frequency range that produce two matches to desired output frequencies are indicated by asterisks. Inspection of Table 1 reveals that two output frequencies may be matched using candidate VCO frequencies of 360, 450, 540, and 600 MHz within the VCO operating frequency range. It will be appreciated by those of ordinary skill in the art that other approaches besides using either a mean of the VCO candidate frequencies or matches within the candidate sets may be used to select an output frequency for VCO 115 and the corresponding divisors used in dividers 110. Moreover, the manner in which the candidate VCO frequencies F1 through F3 were incremented may be altered. For example, although incrementing the lowest candidate VCO frequency from the last iteration produces a highly efficient search, the iteration could follow the pattern: first increment F1, then increment F2, then increment F3, then increment F1, and so on.

Having determined candidate output frequency(s) for VCO 115 and corresponding configurations for output dividers 110, suitable configurations for input divider 155, feedback divider 145, and multiplexer 140 (choosing which output signal 105 to feedback within frequency synthesizer 100) may be determined for each candidate VCO frequency/output divider 110 configuration. One approach would be an exhaustive search based upon the input reference frequency ($F_{in}$) of input signal 130. In such a search, one would first specify a frequency $f_{out}$ of the output signal 105 selected by multiplexer 140, which would be one of f1 through f5. The search space for each divider 155 and 145 is the set of possible dividers {1, 2, 3, . . . 32}. Given the selected frequency $f_{out}$, these search spaces are examined to determine a divisor M for input divider 155 and a divisor N for feedback divider 145 that will satisfy the input conditions for phase detector 150, namely that the frequencies of the input signals at nodes A and B be equal. With respect to frequency synthesizer 100, these input conditions are satisfied when $F_{in}/M = f_{out}/N$. For clarity, in the following discussion only three possible values for $f_{out}$ will be considered. These values will be assumed to be 15, 20, and 30 MHz. In addition, $F_{in}$ will be assumed to be 50 MHz. The following pseudocode describes the resulting search for these values:

For each available $f_{out}$ {15, 20, 30}
  For each M {1, 2, . . . 32}
    For each N {1, 2, . . . , 32}
      If $F_{in}/M = f_{out}/N$, an exact match has been made
    Next N
  Next M Next $f_{out}$ For the above described search, the first exact match that would be identified would be $f_{out}$=20 MHz, M=5, N=2. Those of ordinary skill in the art will appreciated that the above-described search may be modified in a number of fashions. For example, given a value of M, the search space for N could be constrained accordingly. Alternatively, rather than insisting on the exact same frequencies feeding phase detector 150 at nodes A and B, the value of $F_{in}/N$ may be allowed to vary within an acceptable tolerance of $f_{out}/N$. Alternatively, the value of $f_{out}/N$ may be allowed to vary within an acceptable tolerance of $F_{in}/N$. In some instances, the value of the input reference frequency $F_{in}$ may not be specified but instead may be selected from a list of commonly available frequencies. An outer search loop to search through this additional search space may then be added.

For each candidate VCO frequency and the corresponding output divider 110 configuration, one or more input divider 155/feedback source/feedback divider 145 configurations may exist. Each combination of a particular candidate VCO frequency and the corresponding output divider 110 configuration and an input divider 155/feedback source/feedback divider configuration may be denoted as a potential configuration for frequency synthesizer 100. Each identified potential configuration will provide an output frequency for VCO 115 that is within the VCO operating range, divisors for dividers 110, 145, and 155 that are within their dynamic range, and the identity of the feedback source. A number of potential configurations will likely have been identified. In addition, should the frequency of input signal 130 be variable, the potential configuration would include the identity of a suitable input reference frequency.

Given a set of potential configurations, a number of criteria may be used to select a particular potential configuration from the set as most suitable for configuration of frequency synthesizer 100. For example, one solution would be to analyze each potential configuration in the set to identify the most suitable potential configuration. The suitability, or equivalently, the "fitness" of a particular potential configuration may be evaluated using a number of factors. One factor for suitability would be how closely the synthesized output frequencies match the set of desired output frequencies. For example, compare iterations 11 and 12 in Table 1 with respect to a common VCO frequency solution. In both of these iterations, f1' and f3' are matched exactly by the synthesized frequencies f1 and f3 through the selection of the common VCO frequency of 360 MHz. However, f2 equals 360 MHz/4=90 MHz in iteration 11 whereas f2 equals 360 MHz/5=72 MHz in iteration 12. Given that the desired output frequency f2' was 75 MHz with regard to the iterations of Table 1, the error induced in synthesized output frequency f2 is substantially less in iteration 12 as compared to iteration 11. Thus, using the indicia of how closely the synthesized output frequencies match the set of desired output frequencies, the candidate VCO frequency of 360 MHz and the corresponding divisors of V1=6, V2=5, and V3=4 would be favored over the use of divisors V1=6, V2=4, and V3=4.

Operating concerns for VCO 115 may favor selection of a particular VCO output frequency from this set of candidate VCO frequencies. For example, VCO 115 operation may be less noisy when operated mid-range. Or the design of VCO 115 may favor selection of the candidate VCO frequencies at the high end of its operating range. For example, VCO 115 may be designed such that it achieves the lowest noise floor if operated at the high end of its operating frequency range. Similar operating concerns affect the selection of the input frequencies to phase detector 150. In other words, the design of phase detector 150 may be such that more efficient operation is achieved if the values $F_{in}/M$ and $f_{out}/N$ equal a desired frequency or are within a desired frequency range. Thus, a potential configuration with a particular value of M and N that achieves the desired input frequency or satisfies the desired input frequency range to phase detector 150 would be favored under such an indicia of suitability over a potential configuration with values for M and N that do not achieve these goals. It will be appreciated by those of ordinary skill in the art that other criteria for suitability may be used as well. Moreover, rather than identify a plurality of potential configurations, the above-described frequency synthesizer configuration technique may be modified to stop searching as soon as a potential configuration has been identified. Although offering a short computation time, such an approach has the potential for selecting a configuration that is sub-optimal compared to other potential configurations that could have been identified.

Figure 2:
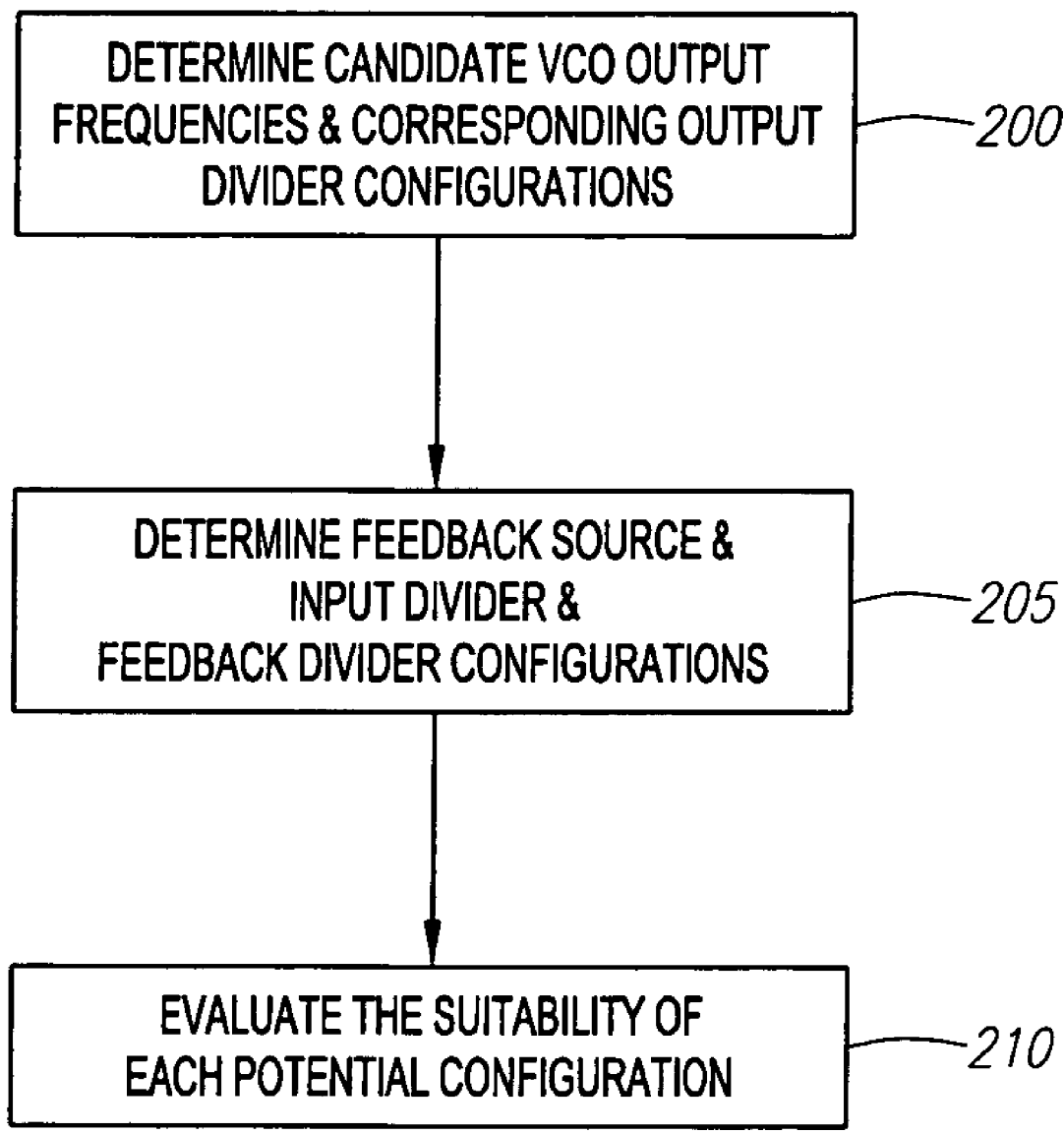
FIG. 2 is a flowchart summarizing a configuration technique for a multiple-output phase-locked loop frequency synthesizer according to an embodiment of the invention.

The frequency synthesizer configuration technique disclosed herein may be summarized in the flowchart of FIG. 2. Starting at step 200, the technique includes an act of determining candidate VCO output frequencies and corresponding output divider configurations. As discussed above, step 200 may be performed in a number of ways, including searching for candidate VCO output frequencies and corresponding output divider configurations that exactly synthesize the desired frequencies for output signals 105. Alternatively, configurations that approximate the desired frequencies may be identified by, for example, successively incrementing the set of desired output frequencies {f1', . . . , fn'} into integer multiples of these output frequencies to produce sets {nf1', . . . , mfn'} that are analyzed for candidate VCO output frequencies. For example, common frequencies or a mean of the frequencies from each iteration may be used to identify candidate VCO output frequencies as discussed above.

Each identified candidate VCO output frequency and the corresponding output divider configuration from step 200 may be denoted as a subconfiguration in that the remaining components for frequency synthesizer 100 have yet to configured. At step 205, a configuration for these remaining components for each subconfiguration are identified. For example, for each subconfiguration, the feedback source should be identified as well as specifying the divisors used in input divider 155 and feedback divider 145. As discussed above, the specification of the feedback source and the dividers for input divider 155 and feedback divider 145 may be performed in a number of ways. The combination of the subconfiguration and the corresponding configuration for the remaining components of frequency synthesizer 100 may be denoted as a potential configuration.

At step 210, the suitability of each potential configuration is evaluated using the suitability criteria discussed above. It will be appreciated that step 210 is unnecessary if steps 200 and 205 are modified to simply identify the first possible potential configuration without any additional searching.

Figure 3:
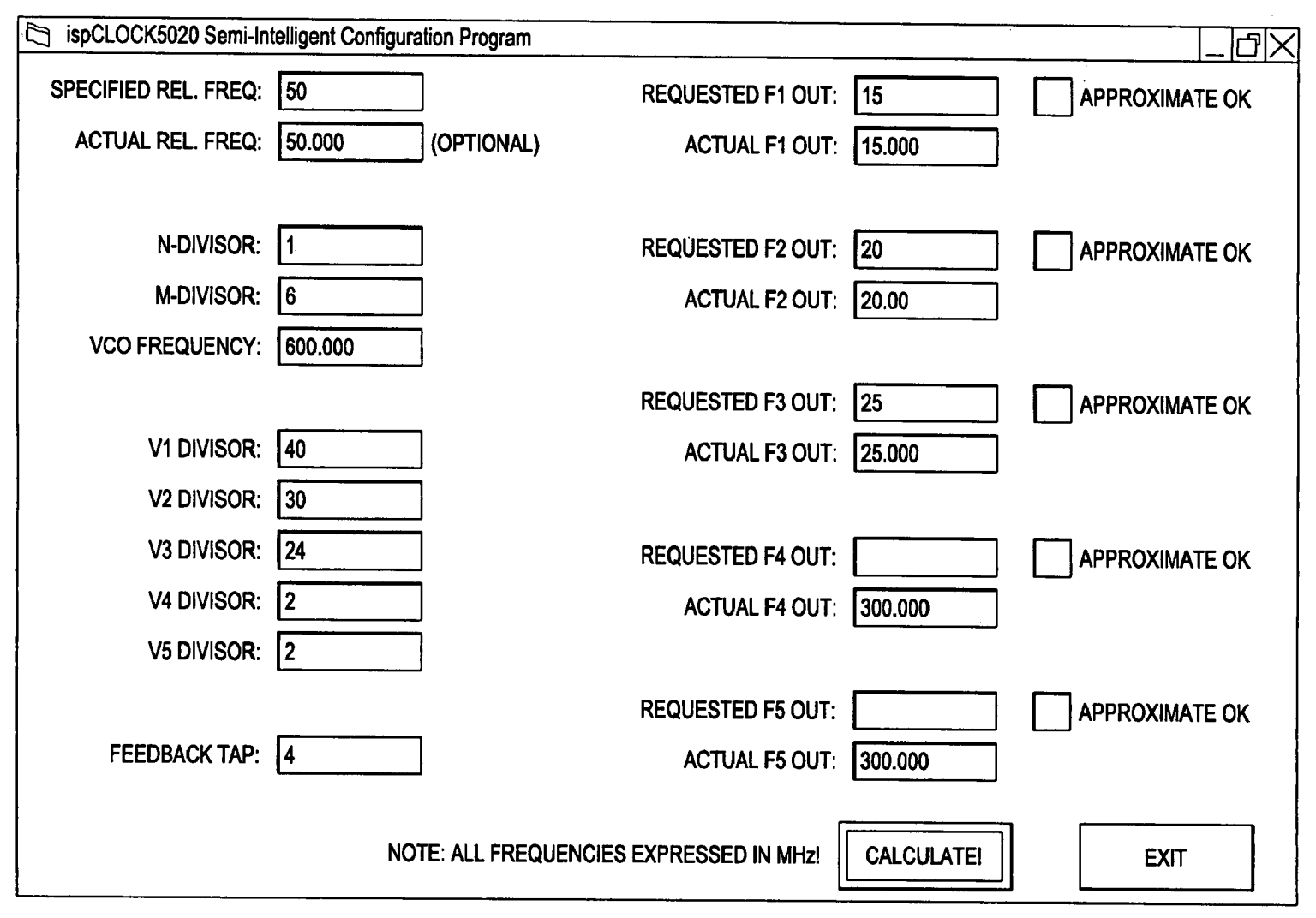

Those of ordinary skill in the art will appreciate that the configuration technique discussed with respect to FIG. 2 may be implemented by a processor such as a personal computer. Moreover, high-level or low-level programming languages could be used to program the processor to implement the technique. Given its portability, a particularly convenient programming language is C or C++. The configuration technique may be incorporated into a software tool and presented to a user via a graphical user interface such as shown in FIG. 3.

The above-described embodiments of the present invention are merely meant to be illustrative and not limiting. For example, the number of output signals in a multiple-output phase-locked loop frequency synthesizer that may be configured according to the present invention is arbitrary. Moreover, in various synthesizers the feedback source may be fixed, the input divider and/or the feedback divider may be missing. In such a case the search space of possible divisors "M" of "N" would be simply 1 or the configuration technique modified accordingly. It will thus be obvious to those skilled in the art that various changes and modifications may be made without departing from this invention in its broader aspects. Accordingly, the appended claims encompass all such changes and modifications as fall within the true spirit and scope of this invention.

I claim:

1. A method of configuring a multiple-output phase-locked loop frequency synthesizer having a VCO and set of output dividers that divide the VCO output frequency, comprising:

providing a desired set of output frequencies;

determining one or more candidate VCO output frequencies and corresponding output divider configurations based upon the desired set of output frequencies, each candidate VCO output frequency and corresponding output divider configuration determining a set of potential synthesized output frequencies;

for each candidate VCO output frequency, determining a corresponding feedback frequency from the set of potential synthesized output frequencies, wherein each combination of a candidate VCO output frequency and the corresponding output divider configuration determines a potential configuration of the frequency synthesizer; and testing the suitability of at least one of the potential configurations based upon predetermined suitability criteria, wherein the testing comprises at least one of the following:

determining how closely the candidate VCO output frequency matches a desired VCO output frequency; and determining how closely the set of potential synthesized output frequencies matches the desired set of output frequencies.

2. The method of claim 1, wherein determining a corresponding feedback frequency includes selecting a frequency from the set of potential synthesized output frequencies.

3. The method of claim 1, wherein the multiple-output phase-locked loop frequency synthesizer includes a feedback divisor, and determining a corresponding feedback frequency includes configuring the feedback divisor to divide a feedback signal to provide feedback frequency.

4. The method of claim 1, wherein the multiple-output phase-locked loop frequency synthesizer includes an input signal divisor, and determining a corresponding feedback frequency includes configuring the input signal divisor to divide an input signal to provide a desired input frequency to the VCO.

5. A machine-readable medium having stored thereon data representing instructions that, when executed by a processor, perform the method of claim 1.

6. A method of configuring a multiple-output phase-locked loop frequency synthesizer, comprising:

providing a desired set of output frequencies;

determining a candidate output frequency(s) for the VCO and corresponding configuration for each output divider based upon the desired set of output frequencies, each candidate output frequency for the VCO and corresponding configuration for the output dividers determining a set of potential synthesized output frequencies;

for each candidate output frequency(s) and corresponding configuration for each output divider, determining a corresponding feedback frequency from the set of potential synthesized output frequencies and a configuration for the synthesizer's input and feedback divisors, wherein each combination of a candidate output frequency and the corresponding configuration for the output dividers, selection of a feedback frequency, and configuration for the feedback and input dividers determines a potential configuration of the frequency synthesizer; and testing the suitability of at least one of the potential configurations based upon predetermined suitability criteria, wherein the testing comprises determining how closely the set of potential synthesized output frequencies matches the desired set of output frequencies.

7. The method of claim 6, wherein the determining a candidate frequency act comprises determining candidate output frequency(s) for the VCO and corresponding configuration for each output divider such that each synthesized frequency exactly matches the corresponding desired output frequency.

8. The method of claim 7, wherein the determining a candidate frequency act comprises determining candidate output frequency(s) for the VCO and corresponding configuration for each output divider such that each synthesized frequency exactly matches or approximates the corresponding desired output frequency.

9. The method of claim 7, wherein the determining a candidate frequency act comprises determining candidate output frequency(s) for the VCO and corresponding configuration for each output divider such that the number of synthesized frequencies that exactly match the corresponding desired output frequency is maximized.

10. The method of claim 6, wherein the determining a feedback signal and a configuration for the synthesizer's input and feedback divisors act comprises:

sequentially selecting a frequency from the set of potential synthesized output frequencies;

assigning the feedback frequency to the selected frequency;

based upon the assigned feedback frequency, determining a divisor M for the input divider and a divisor N such that a first ratio equaling the input reference frequency/M and a second ratio equaling the assigned feedback frequency/N satisfy a predetermined condition.

11. The method of claim 10, wherein M and N are integers.

12. The method of claim 11, wherein the predetermined condition is the first ratio equals the second ratio.

13. The method of claim 11, wherein the predetermined condition is the first ratio is within an acceptable tolerance of the second ratio.

14. The method of claim 6, wherein testing the suitability of at least one of the potential configurations based upon predetermined suitability criteria act comprises determining how closely the candidate VCO output frequency matches a desired VCO output frequency.

15. The method of claim 10, wherein testing the suitability of at least one of the potential configurations based upon predetermined suitability criteria act comprises determining how closely the first and second ratios match a desired input frequency for the phase detector.

16. A machine-readable medium having stored thereon data representing instructions that when executed by a processor, the instructions adapt the processor to perform a method of configuring a multiple-output phase-locked loop frequency synthesizer, comprising:

providing a desired set of output frequencies;

determining a candidate output frequency(s) for the VCO and corresponding configuration for each output divider based upon the desired set of output frequencies, each candidate output frequency for the VCO and corresponding configuration for the output dividers determining a set of potential synthesized output frequencies;

for each candidate output frequency(s) and corresponding configuration for each output divider, determining a corresponding feedback frequency from the set of potential synthesized output frequencies and a configuration for the synthesizer's input and feedback divisors, wherein each combination of a candidate output frequency and the corresponding configuration for the output dividers, selection of a feedback frequency, and configuration for the feedback and input dividers determines a potential configuration of the frequency synthesizer; and testing the suitability of at least one of the potential configurations based upon predetermined suitability criteria, wherein the stored data is such that the testing comprises determining how closely the candidate VCO output frequency matches a desired VCO output frequency.

17. The machine-readable medium of claim 16, wherein the stored data is such that the determining a candidate frequency act comprises determining candidate output frequency(s) for the VCO and corresponding configuration for each output divider such that each synthesized frequency exactly matches the corresponding desired output frequency.

18. The machine-readable medium of claim 17, wherein the stored data is such that the determining a candidate frequency act comprises determining candidate output frequency(s) for the VCO and corresponding configuration for each output divider such that each synthesized frequency exactly matches or approximates the corresponding desired output frequency.

19. The machine-readable medium of claim 16, wherein the stored data is such that the determining a candidate frequency act comprises determining candidate output frequency(s) for the VCO and corresponding configuration for each output divider such that the number of synthesized frequencies that exactly match the corresponding desired output frequency is maximized.

20. The machine-readable medium of claim 16, wherein the stored data is such that the determining a feedback signal and a configuration for the synthesizer's input and feedback divisors act comprises:

sequentially selecting a frequency from the set of potential synthesized output frequencies;

assigning the feedback frequency to the selected frequency;

based upon the assigned feedback frequency, determining a divisor M for the input divider and a divisor N such that a first ratio equaling the input reference frequency/M and a second ratio equaling the assigned feedback frequency/N satisfy a predetermined condition.

21. The machine-readable medium of claim 20, wherein the stored data is such that M and N are integers.

22. The machine-readable medium of claim 21, wherein the stored data is such that the predetermined condition is the first ratio equals the second ratio.

23. The machine-readable medium of claim 21, wherein the stored data is such that the predetermined condition is the first ratio is within an acceptable tolerance of the second ratio.

24. The machine-readable medium of claim 16, wherein the stored data is such that testing the suitability of at least one of the potential configurations based upon predetermined suitability criteria comprises determining how closely the set of potential synthesized output frequencies matches the desired set of output frequencies.

* * * * *